(12) United States Patent
Nakazawa et al.

(10) Patent No.: US 9,507,225 B2
(45) Date of Patent: Nov. 29, 2016

(54) ACTIVE MATRIX SUBSTRATE AND LIQUID CRYSTAL DISPLAY PANEL EQUIPPED WITH SAME

(71) Applicant: Sharp Kabushiki Kaisha, Osaka (JP)

(72) Inventors: Makoto Nakazawa, Osaka (JP); Seiji Kaneko, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 150 days.

(21) Appl. No.: 14/357,965

(22) PCT Filed: Nov. 9, 2012

(86) PCT No.: PCT/JP2012/007201
§ 371 (c)(1),
(2) Date: May 13, 2014

(87) PCT Pub. No.: WO2013/073143
PCT Pub. Date: May 23, 2013

(65) Prior Publication Data
US 2014/0307195 A1 Oct. 16, 2014

(30) Foreign Application Priority Data
Nov. 15, 2011 (JP) ................................. 2011-249573

(51) Int. Cl.
G02F 1/1343 (2006.01)
G02F 1/1362 (2006.01)
H01L 27/12 (2006.01)
G02F 1/1337 (2006.01)

(52) U.S. Cl.
CPC ..... *G02F 1/13439* (2013.01); *G02F 1/136213* (2013.01); *G02F 1/136286* (2013.01); *H01L 27/124* (2013.01); *G02F 1/133707* (2013.01); *G02F 2001/136295* (2013.01); *G02F 2201/40* (2013.01)

(58) Field of Classification Search
CPC ............... G02F 1/134363; G02F 1/13439; G02F 1/136286
USPC .................................................... 349/43, 141
See application file for complete search history.

(56) References Cited

U.S. PATENT DOCUMENTS 6,762,803 B1 * 7/2004 Koide .................. G02F 1/1362
349/138
2002/0159018 A1 10/2002 Kataoka et al.
(Continued)

FOREIGN PATENT DOCUMENTS

JP 2002-107730 A 4/2002
JP 2008-26430 A 2/2008
(Continued)

*Primary Examiner* — Lucy Chien
(74) *Attorney, Agent, or Firm* — Chen Yoshimura LLP

(57) ABSTRACT

The present invention includes: switching elements (5) in respective sub-pixels (P); an interlayer insulating film covering the switching elements (5); a first transparent electrode (18a) on the interlayer insulating film, the first transparent electrode (18a) having openings (18c) for each sub-pixel (P); an inorganic insulating film covering the first transparent electrode (18a); and a plurality of second transparent electrodes (20a) on the inorganic insulating film, each of the second transparent electrodes (20a) being connected to one of the switching elements (5) through the respective openings (18c) in the first transparent electrode (18a). The respective second transparent electrodes (20a) have a line-and-space pattern (F) constituted of line-shaped line parts (L) and spaces (S), the spaces (S) not overlapping the respective openings (18c) in the first transparent electrode (18a).

7 Claims, 8 Drawing Sheets

(56) References Cited

U.S. PATENT DOCUMENTS

2008/0018816 A1* 1/2008 Hattori .............. G02F 1/136213
349/39
2008/0074599 A1 3/2008 Yamaguchi et al.
2009/0059110 A1 3/2009 Sasaki et al.

FOREIGN PATENT DOCUMENTS

| JP | 2008-83389 A | 4/2008 |
| JP | 2009-58913 A | 3/2009 |
| JP | 2010-109130 A | 5/2010 |

* cited by examiner

ACTIVE MATRIX SUBSTRATE AND LIQUID CRYSTAL DISPLAY PANEL EQUIPPED WITH SAME

TECHNICAL FIELD

The present invention relates to an active matrix substrate and a liquid crystal display panel provided therewith, and particularly relates to an active matrix substrate having auxiliary capacitances using transparent electrodes and a liquid crystal display panel provided therewith.

BACKGROUND ART

An active matrix driven liquid crystal display panel includes an active matrix substrate having switching elements such as thin-film transistors (hereinafter, also referred to as "TFTs") for each sub-pixel, which are the smallest units of an image, an opposite substrate facing the active matrix substrate, and a liquid crystal layer between these two substrates, for example. In many active matrix substrates, an auxiliary capacitance is provided in each sub-pixel to stably maintain the liquid crystal layer, or namely, the charge supplied to the liquid crystal capacitances of the respective sub-pixels. In liquid crystal display panels, there is always a demand for a greater proportion of area in each sub-pixel to be able to let light from the backlight pass through, or in other words, for a higher aperture ratio. Furthermore, in liquid crystal display panels, a single pixel is constituted of a sub-pixel for red gradient display, a sub-pixel for green gradient display, and a sub-pixel for blue gradient display, for example.

A liquid crystal display device and a method of manufacturing the same is disclosed in Patent Document 1, for example, in which auxiliary capacitances are formed by transparent electrodes formed on an interlayer insulating film, a coated transparent insulating film covering the transparent electrodes, and pixel electrodes on the coated transparent insulating film. This is done to improve the aperture ratio and increase the auxiliary capacitance.

RELATED ART DOCUMENT

Patent Document

Patent Document 1: Japanese Patent Application Laid-Open Publication No. 2008-26430

SUMMARY OF THE INVENTION

Problems to be Solved by the Invention

However, in an active matrix substrate that includes TFTs in the respective sub-pixels, an organic insulating film covering the respective TFTs, first transparent electrodes on the organic insulating film, an inorganic insulating film covering the first transparent electrodes, and second transparent electrodes provided on the inorganic insulating film and connected to the respective TFTs, and in which auxiliary capacitances are formed by the first transparent electrodes, second transparent electrodes, and the inorganic insulating film therebetween, there are openings in the respective first transparent electrodes forming a portion of the auxiliary capacitance for the respective sub-pixels, and these openings ensure an electrical connection between the TFTs and the second transparent electrodes.

The first transparent electrodes are commonly formed by wet etching a film made of an oxide semiconductor material such as IZO (indium zinc oxide) or ITO (indium tin oxide); therefore, the side walls of the respective openings are steep, and this is likely to have a negative impact on the coatability of the inorganic insulating film deposited above the openings. Thus, in the oxide semiconductor film deposited on the inorganic insulating film in order to form the second transparent electrodes, there is a risk that the level difference corresponding to the side walls of the respective openings in the inorganic insulating film could lower film quality, or in other words, that the etching speed at the portions with level differences will be high. The second transparent electrodes have a line-and-space pattern for regulating the orientation of the liquid crystal layer. Specifically, at least a portion of the second electrodes are formed in a comb shape, for example, and when forming a narrow over-part that goes over the first transparent electrodes across the inorganic insulating film on the second transparent electrodes, there is a risk that the etchant will leak from the level-difference parts of the oxide semiconductor film when wet etching the oxide semiconductor film on the inorganic insulating film. In this case, the over-part of the second transparent electrodes will be excessively etched from the side during wet etching of the oxide semiconductor film, and thus, the second transparent electrodes will be disconnected at the over-part.

The present invention was made in view of these points, and aims at suppressing disconnection of line-and-space pattern second transparent electrodes disposed on first transparent electrodes through an inorganic insulating film.

Means for Solving the Problems

To achieve the above-mentioned aims, the present invention has a configuration in which respective second transparent electrodes have a line-and-space pattern constituted of line-shaped line parts and spaces that do not overlap respective openings in a first transparent electrode.

Specifically, an active matrix substrate according to the present invention has a plurality of sub-pixels arranged in a matrix; a switching element disposed in each of the sub-pixels; at least one interlayer insulating film covering the switching elements and having contact holes formed in the respective sub-pixels, the contact holes reaching the respective switching elements; a first transparent electrode disposed on the at least one interlayer insulating film and having an opening in each of the respective sub-pixels; an inorganic insulating film covering the first transparent electrode; and a plurality of second transparent electrodes disposed on the inorganic insulating film and respectively connecting to the switching elements through the respective contact holes in the at least one interlayer insulating film and the respective openings in the first transparent electrode, wherein the respective second transparent electrodes have a line-and-space pattern constituted of line parts and spaces, the spaces being disposed so as not to overlap the respective openings in the first transparent electrode.

With this configuration, the respective second transparent electrodes on the inorganic insulating film have a line-and-space pattern constituted of line-shaped line parts and spaces that do not overlap the respective openings in the first transparent electrode; therefore, the oxide conductive film acting as the second transparent electrodes is deposited on the inorganic insulating film, and thereafter, when wet etching this oxide conductive film, it is difficult for the etchant to contact the oxide conductive film level-difference parts formed on the edges of the respective openings in the first transparent electrode through the inorganic insulating film. Specifically, in the wet etching of the oxide conductive film, the portions of the oxide conductive film left by the resist become the line parts of the respective second transparent electrodes, and the portions of the oxide conductive film removed by the etchant become the spaces of the respective second transparent electrodes; thus, the spaces of the respective second transparent electrodes are arranged so as not to overlap the respective openings in the first transparent electrode, thereby making it difficult for the etchant to contact the level-difference parts of the oxide conductive film. Therefore, it is difficult for the etchant to leak to the level-difference parts of the oxide conductive film, and thus, unwanted etching caused by the level-difference parts of the oxide conductive film during formation of the line parts of the respective second transparent electrodes is suppressed. This suppresses disconnection of the line parts of the respective second transparent electrodes, and therefore, disconnection of the second transparent electrodes having a line-and-space pattern disposed on the first transparent electrode through the inorganic insulating film is suppressed.

The respective second transparent electrodes may cover the respective openings in the first transparent electrode across the inorganic insulating film.

With this configuration, the respective second transparent electrodes cover the respective openings in the first transparent electrode through the inorganic insulating film; thus, the etchant will hardly contact the oxide conductive film level-difference parts formed on the edges of the respective openings in the first transparent electrode through the inorganic insulating film, and disconnection of the second transparent electrodes provided on the first transparent electrode through the inorganic insulating film will be suppressed.

The respective openings in the first transparent electrode may be rectangular, and the respective second transparent electrodes may cover at least one edge of the respective openings in the first transparent electrode across the inorganic insulating film.

With this configuration, the respective openings in the first transparent electrode are rectangular, and the respective second transparent electrodes cover at least one edge of the respective openings in the first transparent electrode through the inorganic insulating film; therefore, it is difficult for etchant to contact the oxide conductive film level-difference parts on the side covering the edge of the respective openings in the first transparent electrode, and this suppresses disconnection of the second transparent electrodes provided on the first transparent electrode through the inorganic insulating film.

The inorganic insulating film may be a silicon oxide film or a silicon nitride film deposited by sputtering.

With this configuration, the inorganic insulating film is constituted of a silicon oxide film or silicon nitride film deposited by sputtering; therefore, the deposition temperature at the time of depositing the inorganic insulating film is lower than if CVD (chemical vapor deposition) were used, and characteristic degradation of the semiconductor layer constituted of the oxide semiconductor forming the switching elements is suppressed, for example. The hydrogen concentration of an inorganic insulating film deposited by sputtering is very low and below the hydrogen concentration of an inorganic insulating film formed by CVD; thus, an inorganic insulating film deposited by sputtering can be assessed by analysis devices such as TDS (thermal desorption (mass) spectrometry) or SIMS (secondary ion mass spectrometry).

A liquid crystal display panel of the present invention includes the active matrix substrate according to any one of the configurations above, an opposite substrate that faces the active matrix substrate, and a liquid crystal layer disposed between the active matrix substrate and the opposite substrate.

With this configuration, in the active matrix substrate, the respective second transparent electrodes on the inorganic insulating film have a line-and-space pattern constituted of line-shaped line parts and spaces that do not overlap the respective openings in the first transparent electrode; therefore, the oxide conductive film acting as the second transparent electrodes is deposited on the inorganic insulating film, and thereafter, when wet etching this oxide conductive film, it is difficult for the etchant to contact the oxide conductive film level-difference parts formed on the edges of the respective openings in the first transparent electrode through the inorganic insulating film. Specifically, in the wet etching of the oxide conductive film, the portions of the oxide conductive film left by the resist become the line parts of the respective second transparent electrodes, and the portions of the oxide conductive film removed by the etchant become the spaces of the respective second transparent electrodes; thus, the spaces of the respective second transparent electrodes are arranged so as not to overlap the respective openings in the first transparent electrode, thereby making it difficult for the etchant to contact the level-difference parts of the oxide conductive film. Therefore, it is difficult for the etchant to leak to the level-difference parts of the oxide conductive film, and thus, unwanted etching caused by the level-difference parts of the oxide conductive film during formation of the line parts of the respective second transparent electrodes is suppressed. In a liquid crystal display panel provided with an active matrix substrate, this suppresses disconnection of the line parts of the respective second transparent electrodes, and therefore, disconnection of the second transparent electrodes having a line-and-space pattern disposed on the first transparent electrode through the inorganic insulating film is suppressed.

A voltage may be applied to the liquid crystal layer through the first transparent electrode and the respective second transparent electrodes.

With this configuration, a voltage is applied to the liquid crystal layer through the first transparent electrode and the respective second transparent electrodes, and thus, in an active matrix substrate included in a so-called lateral electrical field liquid crystal display panel, disconnection of the line parts of the respective second transparent electrodes is suppressed, and disconnection of the line-and-space pattern second transparent electrodes disposed on the first transparent electrode through the inorganic insulating film is suppressed.

A common electrode may be disposed on the opposite substrate, and a voltage may be applied to the liquid crystal layer through the respective second transparent electrodes and the common electrode.

With this configuration, the common electrode is provided on the opposite substrate and the voltage is applied to the liquid crystal layer through the respective second transparent electrodes and the common electrode, and thus, in an active matrix substrate included in a so-called vertical electrical field liquid crystal display panel, disconnection of the line parts of the respective second transparent electrodes is suppressed, and disconnection of the line-and-space pattern second transparent electrodes disposed on the first transparent electrode through the inorganic insulating film is suppressed.

Effects of the Invention

According to the present invention, the respective second transparent electrodes have a line-and-space pattern constituted of a line-shaped line part and a space that is provided so as not to overlap the respective openings of the first transparent electrode; thus, disconnection of the line-and-space pattern second transparent electrodes provided on the first transparent electrode through the inorganic insulating film can be suppressed.

DETAILED DESCRIPTION OF EMBODIMENTS

An embodiment of the present invention will be described in detail below with reference to drawings. The present invention is not limited to the embodiments below.

<Embodiment 1>

Figure 1:
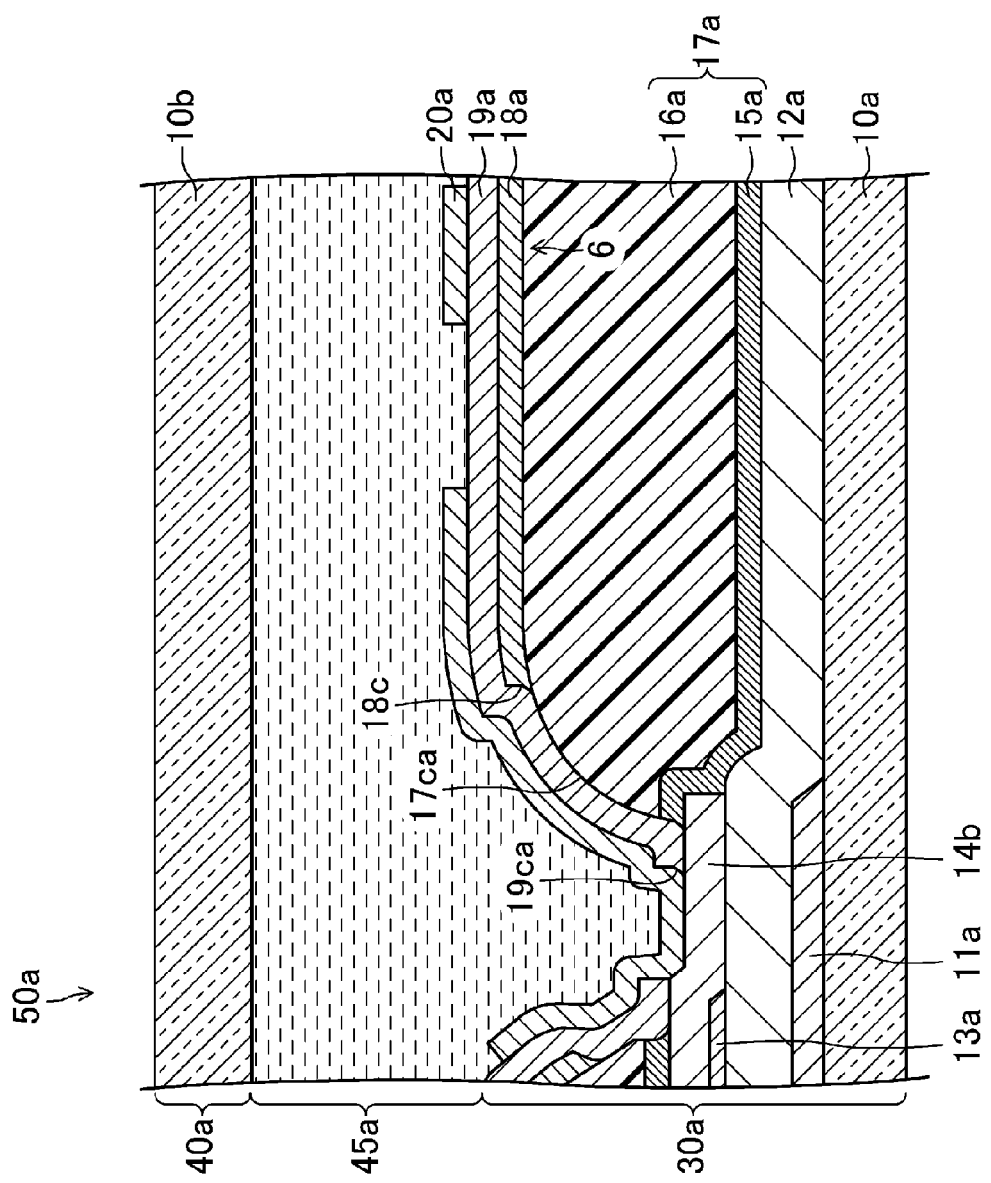
FIG. 1 is a cross-sectional view of a liquid crystal display panel according to Embodiment 1.
Figure 2:
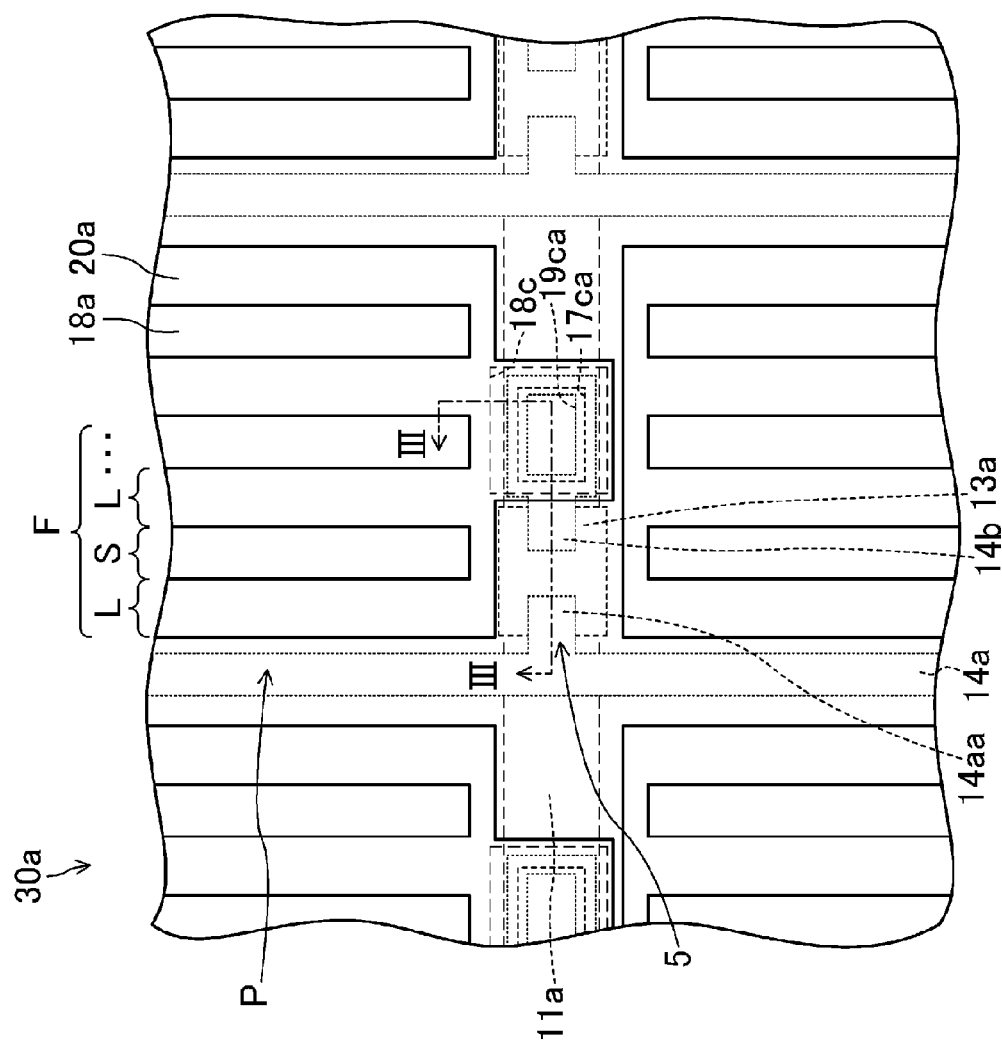
FIG. 2 is a plan view of an active matrix substrate forming a part of the liquid crystal display panel of Embodiment 1.
Figure 3:
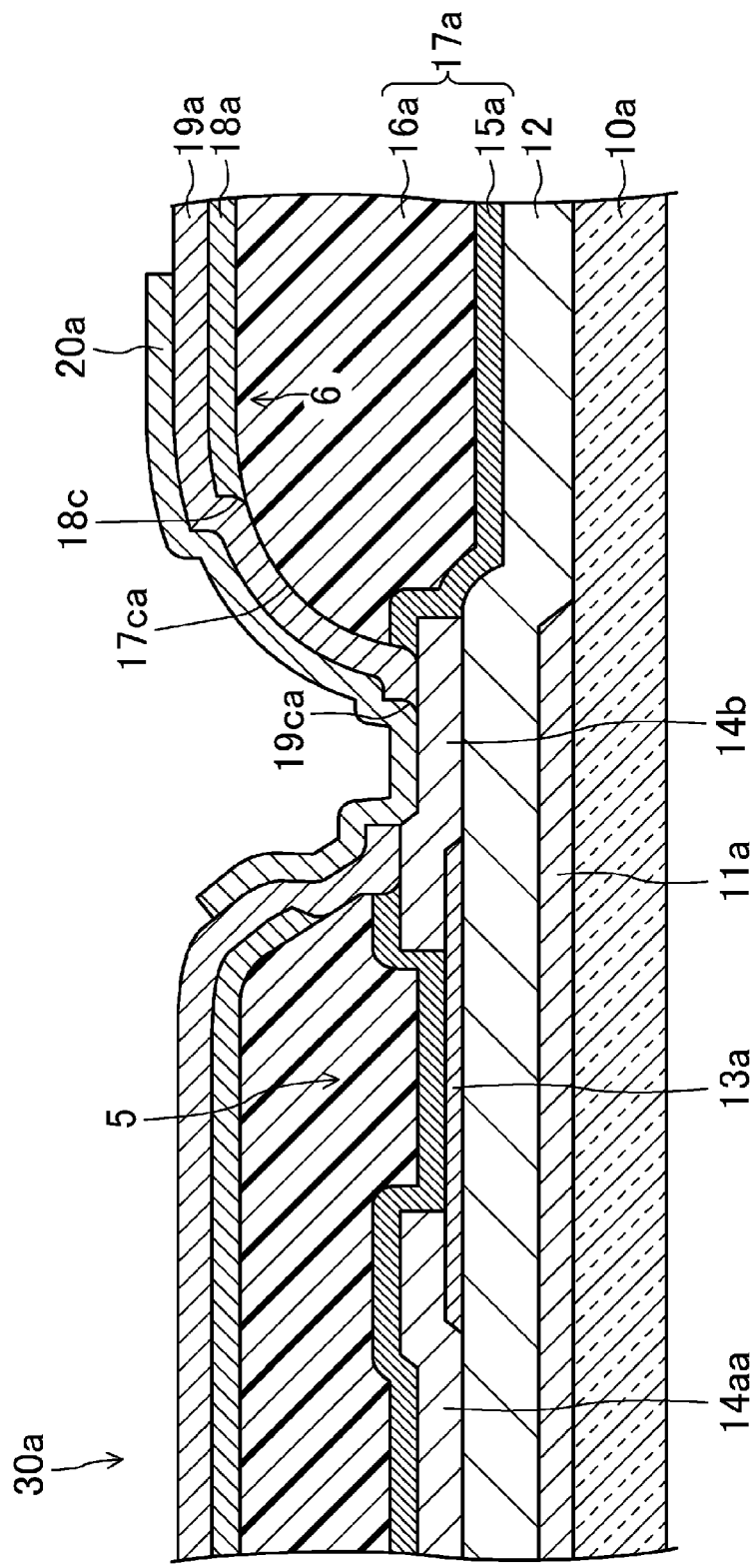
FIG. 3 is a cross-sectional view of the active matrix substrate of FIG. 2 along the line III-III.
Figure 4:
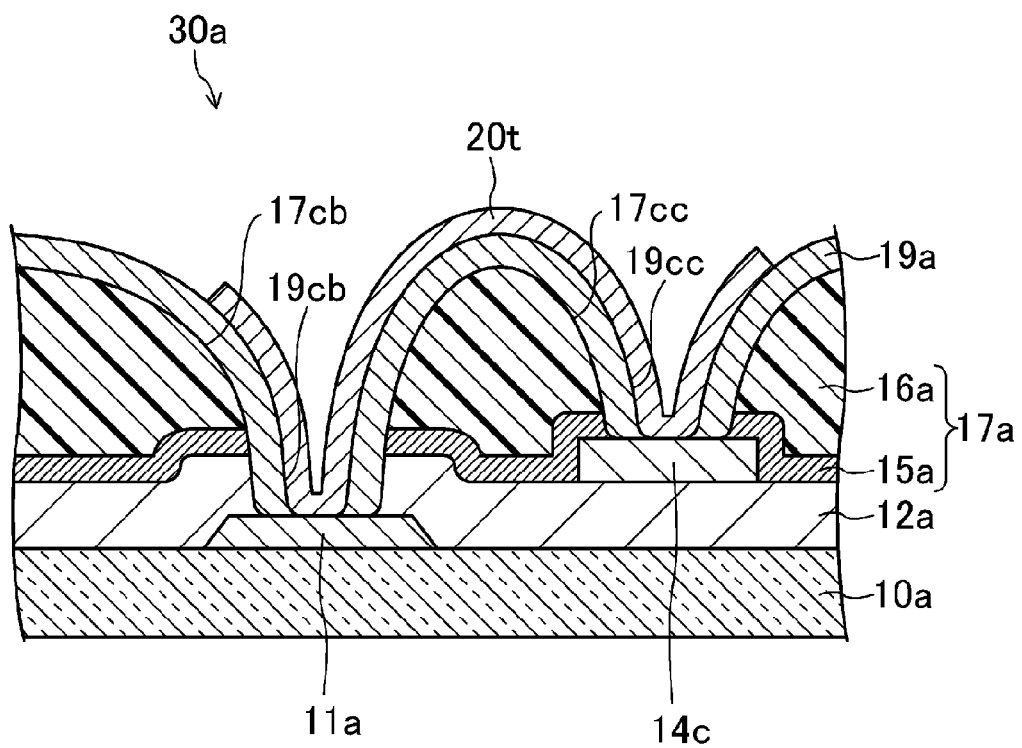
FIG. 4 is another cross-sectional view of the active matrix substrate forming a part of the liquid crystal display panel of Embodiment 1.

FIGS. 1 to 4 show an active matrix substrate and a liquid crystal display panel provided therewith according to Embodiment 1 of the present invention. Specifically, FIG. 1 is a cross-sectional view of a liquid crystal display panel 50a of the present embodiment. FIG. 2 is a plan view of an active matrix substrate 30a forming a part of the liquid crystal display panel 50a, and FIG. 3 is a cross-sectional view of the active matrix substrate 30a of FIG. 2 along the line III-III. FIG. 4 is another cross-sectional view of the active matrix substrate 30a.

As shown in FIG. 1, the liquid crystal display panel 50a includes: the active matrix substrate 30a and an opposite substrate 40a provided so as to face each other; a liquid crystal layer 45a between the active matrix substrate 30a and the opposite substrate 40a; and a frame-shaped sealing member (not shown) for bonding the active matrix substrate 30a and the opposite substrate 40a together and for sealing the liquid crystal layer 45a between the active matrix substrate 30a and the opposite substrate 40a. In the liquid crystal display panel 50a, a display area that performs image display is defined inside the sealing member, and a plurality of pixels are arranged in a matrix in this display area. A sub-pixel P (see FIG. 2) for red gradient display, a sub-pixel P for green gradient display, and a sub-pixel P for blue gradient display, for example, are arrayed in the respective pixels.

As shown in FIGS. 1 to 3, the active matrix substrate 30a includes: a transparent substrate 10a; a plurality of gate lines 11a on the transparent substrate 10a extending parallel to each other in the horizontal direction of FIG. 2; a gate insulating film 12a covering the respective gate lines 11a; a plurality of source lines 14a on the gate insulating film 12a extending parallel to each other in the direction (vertical direction in FIG. 2) that intersects the respective gate lines 11a; a plurality of TFTs 5, one TFT being arranged at each intersection of the respective gate lines 11a and the respective source lines 14a, or namely, in each of the respective sub-pixels P; an interlayer insulating film 17a covering the respective TFTs 5 and the respective source lines 14a; a common electrode 18a provided on the interlayer insulating film 17a as the first transparent electrode; an inorganic insulating film 19a covering the common electrode 18a; a plurality of pixel electrodes 20a connected to the respective TFTs 5 and provided in a matrix on the inorganic insulating film 19a as the second transparent electrodes; and an alignment film (not shown) covering the respective pixel electrodes 20a.

The gate lines 11a extend to outside the display area, and as shown in FIG. 4, the gate line 11a is connected to an extending wiring line 14c outside the display area through a contact hole 17cb formed in a multilayer film of the interlayer insulating film 17a and the gate insulating film 12a, a contact hole 17cc formed in the interlayer insulating film 17a, contact holes 19cb and 19cc formed in the inorganic insulating film 19a, and a transparent electrode layer 20t.

As shown in FIGS. 2 and 3, the TFT 5 includes: a gate electrode (11a) on the transparent substrate 10a; the gate insulating film 12a covering the gate electrode (11a); an island-shaped semiconductor layer 13a provided on the gate insulating film 12a so as to overlap the gate electrode (11a); and a source electrode 14aa and a drain electrode 14b provided with a gap therebetween on the semiconductor layer 13a.

As shown in FIG. 2, the gate electrode (11a) is a part of the respective gate lines 11a.

As shown in FIG. 2, the source electrode 14aa is a part of the respective source lines 14a protruding towards the respective sub-pixels P.

As shown in FIGS. 2 and 3, the drain electrode 14b connects to the pixel electrode 20a through contact holes 17ca formed in the interlayer insulating film 17a for the respective sub-pixels P, openings 18c formed in the common electrode 18a for the respective sub-pixels P, and contact holes 19ca formed in the inorganic insulating film 19a for the respective sub-pixels P.

As shown in FIGS. 1 to 3, the common electrode 18a is formed integrally across all the sub-pixels P, and has the rectangular-shaped openings 18c for connecting the drain electrodes 14b to the pixel electrodes 20a in the respective sub-pixels P. As shown in FIGS. 1 to 3, the common electrode 18a forms an auxiliary capacitance 6 by overlapping the pixel electrodes 20a across the inorganic insulating film 19a in the respective sub-pixels P.

As shown in FIGS. 1, 3, and 4, the interlayer insulating film 17a includes a first interlayer insulating film 15a on the transparent substrate 10a side, and a second interlayer insulating film 16a stacked on the first interlayer insulating film 15a. As shown in FIGS. 1 to 4, the contact holes 17ca for connecting the drain electrodes 14b to the pixel electrodes 20a, the contact holes 17cb for connecting the gate lines 11a to the transparent electrode layer 20t, and the contact holes 17cc for connecting the transparent electrode layer 20t to the extended wiring lines 14c are provided in the interlayer insulating film 17a.

As shown in FIGS. 1 to 4, the contact holes 19ca for connecting the drain electrodes 14b to the pixel electrodes 20a, the contact holes 19cb for connecting the gate lines 11a to the transparent electrode layer 20t, and the contact holes 19cc for connecting the transparent electrode layer 20t to the extended wiring lines 14c are provided in the inorganic insulating film 19a.

As shown in FIG. 2, the pixel electrode 20a has a ladder shape and has a line-and-space pattern F constituted of a plurality of line-shaped line parts L extending parallel to each other and a plurality of spaces S respectively extending between the plurality of line parts L. As shown in FIG. 2, the spaces S are provided so as not to overlap the respective openings 18c in the common electrode 18a. As shown in FIG. 2, the pixel electrodes 20a cover the respective openings 18c in the common electrode 18a through the inorganic insulating film 19a.

As shown in FIG. 1, the opposite substrate 40a includes: a transparent substrate 10b; a grid-shaped black matrix (not shown) on the transparent substrate 10b; a plurality of colored layers (not shown) such as red layers, green layers, and blue layers respectively disposed between the respective grid lines of the black matrix; a plurality of column-shaped photo spacers (not shown) on the black matrix; and an alignment film (not shown) covering the respective colored layers, black matrix, and photo spacers.

The liquid crystal layer 45a is made of a nematic liquid crystal material or the like that has electro-optic characteristics.

The liquid crystal display panel 50a with the configuration above applies a prescribed voltage for the respective sub-pixels P to the liquid crystal layer 45a in order to change the orientation state of the liquid crystal layer 45a with a lateral electric field. This changes the transmittance of light passing through the panel for the respective sub-pixels P in order to display an image.

Next, a method a manufacturing the liquid crystal display panel 50a of the present embodiment will be explained. A method of manufacturing the liquid crystal display panel 50a of the present embodiment includes making an active matrix substrate, making an opposite substrate, and injecting liquid crystal.

<Making Active Matrix Substrate>

First, a titanium film (thickness of approximately 30 nm), an aluminum film (thickness of approximately 100 nm), a titanium film (thickness of approximately 50 nm), or the like are sequentially deposited onto the entire substrate of the transparent substrate 10a, which is a glass substrate, plastic substrate, or the like, for example. Thereafter, the gate lines 11a including the gate electrodes (11a) are formed by performing photolithography, dry-etching using the chlorine-based gas, and removal of the resist on this metal multilayer film.

Next, a silicon nitride film (thickness of approximately 300 nm) and a silicon oxide film (thickness of approximately 50 nm) are deposited by CVD (chemical vapor deposition), for example, on the entire substrate where the gate lines 11a are formed in order to form the gate insulating film 12a.

Then, an In—Ga—Zn—O oxide semiconductor film (thickness of approximately 50 nm) is deposited by sputtering, for example, onto the entire substrate where the gate insulating film 12a is formed and then photolithography, wet etching using oxalic acid, and removal of the resist are performed on this oxide semiconductor film in order to form the semiconductor layer 13a. In the present embodiment, an oxide semiconductor such as In—Ga—Zn—O was shown as an example of the semiconductor layer 13a, but the semiconductor layer 13a may be amorphous silicon or polysilicon, for example.

A titanium film (thickness of approximately 30 nm), an aluminum film (thickness of approximately 100 nm), a titanium film (thickness of 50 nm), or the like are sequentially deposited by sputtering, for example, onto the entire substrate where the semiconductor layer 13a is formed. Thereafter, photolithography, dry etching with a chlorine-based gas, and removal of the resist are performed on this metal multilayer film in order to form the source electrodes 14aa and drain electrodes 14b, thereby forming the TFTs 5, and to form the source lines 14a and extending wiring lines 14c.

Next, a silicon oxide film (thickness of approximately 200 nm) is deposited by CVD or sputtering, for example, on the entire substrate where the TFTs 5 are formed in order to form the first interlayer insulating film 15a.

A photosensitive resin made of a photosensitive acrylic resin or the like is coated by spin coating or slit coating, for example, on the entire substrate where the first interlayer insulating film 15a is formed. Thereafter, the photosensitive resin film is exposed, developed, and baked in order to form the second interlayer insulating film 16a at a thickness of approximately 2.5 μm, the second interlayer insulating film 16a having the contact holes 17ca, 17cb, and 17cc.

Dry etching with a fluorine-based gas and removal of the resist are performed on the first interlayer insulating film 15a exposed in the second interlayer insulating film 16a, and on the multilayer film of the first interlayer insulating film 15a and the gate insulating film 12a in order to form the respective contact holes in the gate insulating film 12a and the first interlayer insulating film 15a.

Next, an oxide conductive film (thickness of approximately 50 nm) such as an amorphous ITO film or an IZO film is deposited by sputtering, for example, on the entire substrate where the respective contact holes have been formed in the gate insulating film 12a and the first interlayer insulating film 15a. Thereafter, photolithography, etching with oxalic acid, and removal of the resist are performed on the oxide conductive film in order to form the common electrode 18a.

Then, an inorganic insulating film such as a silicon oxide film or a silicon nitride film is formed by sputtering, for example, at a thickness of approximately 200 nm to 400 nm on the entire substrate where the common electrode 18a is formed. Thereafter, photolithography, etching with a fluorine-based gas, and removal of the resist are performed on this inorganic insulating film in order to form the inorganic insulating film 19a. In the present embodiment, a method was shown in which the silicon oxide film or silicon nitride film deposited by sputtering is patterned to form the inorganic insulating film 19, but if the semiconductor layer 13a is amorphous silicon or polysilicon, for example, then there is no risk of a characteristic degradation of the semiconductor layer 13a resulting from reduction in the CVD process; thus, the inorganic insulating film 19a may be formed by patterning a silicon oxide film or a silicon nitride film that has been deposited by CVD.

Next, an oxide conductive film (thickness of approximately 50 nm) such as an amorphous ITO film or an IZO film is deposited by sputtering, for example, on the entire substrate where the inorganic insulating film 19a has been formed. Thereafter, photolithography, etching with oxalic acid, and removal of the resist are performed on the oxide conductive film in order to form the pixel electrodes 20a.

Finally, a polyimide resin film is coated by a printing method, for example, on the entire substrate where the pixel electrodes 20a are formed. Thereafter, this resin film undergoes a baking and rubbing treatment to form the alignment film.

The active matrix substrate 30a can be made in the manner above.

<Making Opposite Substrate>

First, a black photosensitive resin is coated by spin coating or slit coating, for example, onto the entire substrate of the transparent substrate 10b, which is a glass substrate, plastic substrate, or the like. Thereafter, this photosensitive resin film is exposed, developed, and baked to form the black matrix at a thickness of approximately 2.0 µm.

Next, a red, green, or blue photosensitive resin is coated by spin coating or slit coating, for example, onto the entire substrate where the black matrix has been formed. Thereafter, this photosensitive resin film is exposed, developed, and baked to form the colored layer of the chosen color (a red layer, for example) at a thickness of approximately 2.0 µm. Then, repeating a similar step for the other two colors, colored layers of the other two colors (green layer and blue layer, for example) are formed with a thickness of approximately 2.0 µm.

A photosensitive resin film made of a photosensitive acrylic resin or the like is coated by spin coating or slit coating, for example, on the entire substrate where the respective colored layers have been formed. Thereafter, this photosensitive resin film is exposed, developed, and baked to form photo spacers at a thickness of approximately 4.0 µm.

Finally, a polyimide resin film is coated by a printing method, for example, on the entire substrate where the photo spacers have been formed. Thereafter, this resin film undergoes a baking and rubbing treatment to form the alignment film.

The opposite substrate 40a can be made in this manner.

<Injecting Liquid Crystal>

First, a sealing material made of a resin that is both UV (ultraviolet) curable and thermally curable or the like is printed in a frame shape on the surface of the opposite substrate 40a made in the step of making the opposite substrate, for example. Thereafter, liquid crystal material is dripped into the sealing member.

Next, the opposite substrate 40a where the liquid crystal material has been dripped and the active matrix substrate 30a made in the step of making the active matrix substrate are bonded together under reduced pressure. Thereafter, this bonded member is introduced to atmospheric pressure to pressurize the front surface and rear surface thereof.

UV light is radiated on the sealing member sandwiched between this bonded member, and thereafter the sealing member is cured by heating the bonded member.

Lastly, by dicing the bonded member in which the sealing member has been cured, for example, unnecessary portions are removed.

The liquid crystal display panel 50a can be made in the manner above.

As described above, according to the active matrix substrate 30a of the present embodiment and the lateral electrical field liquid crystal display panel 50a provided therewith, the respective pixel electrodes 20a on the inorganic insulating film 19a on the active matrix substrate 30a have the line-and-space pattern F that are each constituted of the line-shaped line parts L and the spaces S provided so as not to overlap the respective openings 18c in the common electrode 18a; therefore, after the oxide conductive film serving as the pixel electrodes 20a is deposited on the inorganic insulating film 19a, it is possible to make it difficult for the etchant to contact the level-difference part of the oxide conductive film formed on the edges of the respective openings 18c in the common electrode 18a through the inorganic insulating film 19a when wet etching this oxide conductive film. Specifically, in the wet etching of the oxide conductive film, the portions of the oxide conductive film left by the resist become the line parts L of the respective pixel electrodes 20a, and the portions of the oxide conductive film removed by the etchant become the spaces S of the respective pixel electrodes 20a; thus, it is possible to make it difficult for the etchant to contact the level-difference part of the oxide conductive film by arranging the spaces S of the respective pixel electrodes 20a so as not to overlap the respective openings 18c of the common electrode 18a. Therefore, it is difficult for the etchant to leak to the level-difference parts of the oxide conductive film, and thus, unwanted etching caused by the level-difference parts of the oxide conductive film during formation of the line parts L of the respective pixel electrode 20a can be suppressed. This allows disconnection of the line parts L of the respective pixel electrodes 20a to be suppressed; therefore, it is possible to suppress disconnection of the line-and-space pattern F pixel electrodes 20a disposed on the common electrode 18a through the inorganic insulating film 19a.

Furthermore, according to the active matrix substrate 30a of the present embodiment and the liquid crystal display panel 50a provided therewith, the respective pixel electrodes 20a cover the respective openings 18c of the common electrode 18a through the inorganic insulating film 19a; therefore, the etchant will hardly come into contact with the level-difference parts of the oxide conductive film formed on the edges of the respective openings 18c of the common electrode 18a through the inorganic insulating film 19a, and disconnection of the pixel electrodes 20a disposed on the common electrode 18a through the inorganic insulating film 19a can be reliably suppressed.

According to the active matrix substrate 30a of the present embodiment and the liquid crystal display panel 50a provided therewith, the inorganic insulating film 19a is constituted of the silicon oxide film or silicon nitride film deposited by sputtering; thus, the deposition temperature during deposition of the inorganic insulating film 19a is lower than if deposition were performed by CVD, and characteristic degradation due to reduction of the semiconductor layer 13a made of the oxide semiconductor forming a part of the TFT 5 can be suppressed.

<Embodiment 2>

Figure 5:
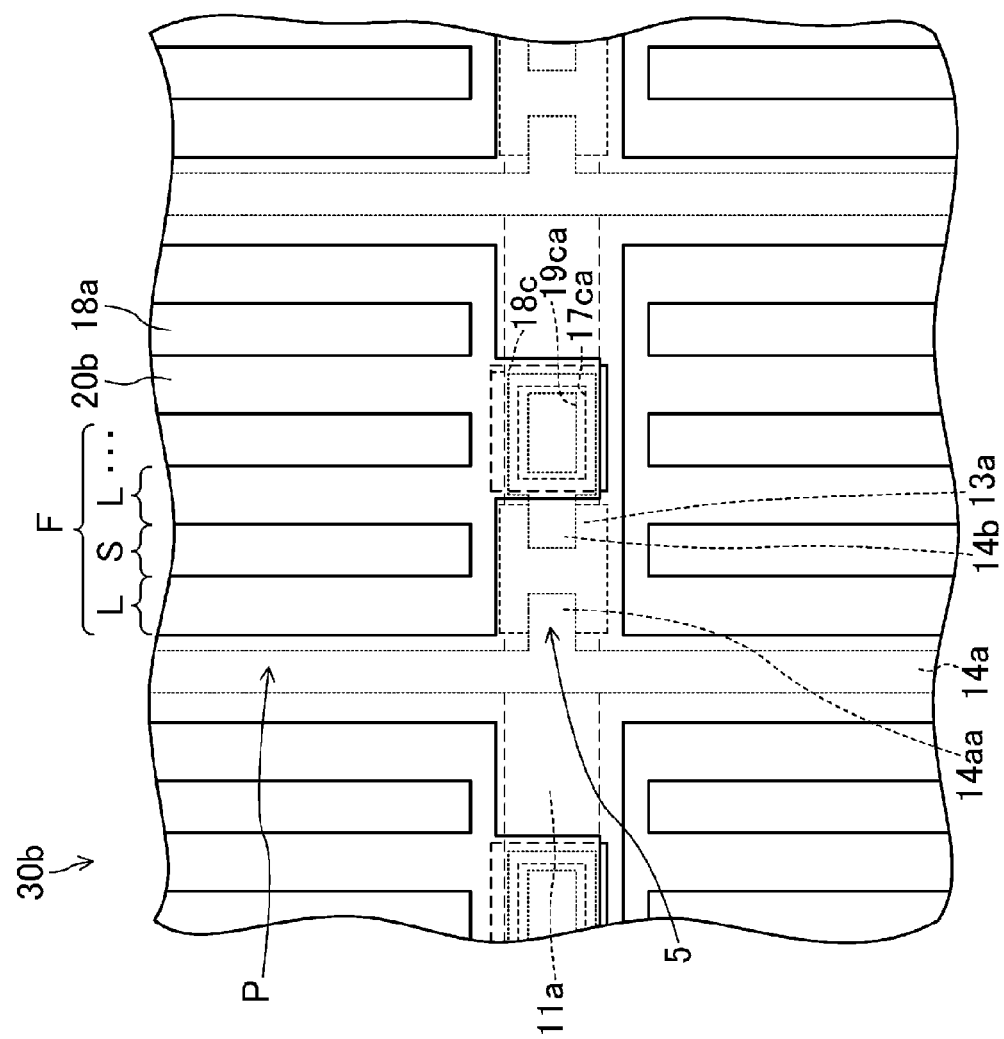
FIG. 5 is a plan view of an active matrix substrate forming a part of a liquid crystal display panel of Embodiment 2.

FIG. 5 is a plan view of an active matrix substrate 30b forming a part of a liquid crystal display panel of the present embodiment. In each embodiment below, the same members as those in FIGS. 1 to 4 are given the same reference characters, and the descriptions thereof are not repeated.

In Embodiment 1, the active matrix substrate 30a having the pixel electrodes 20a covering the respective openings 18c of the common electrode 18a was shown as an example, but in the present embodiment, the active matrix substrate 30b having pixel electrodes 20b covering a portion of respective openings 18c of a common electrode 18a is shown as an example.

The liquid crystal display panel of the present embodiment includes: the active matrix substrate 30b and an opposite substrate (40a, see FIG. 1) facing each other; a liquid crystal layer (45a, see FIG. 1) between the active matrix substrate 30b and the opposite substrate 40a; and a frame-shaped sealing member for bonding the active matrix substrate 30b and the opposite substrate 40a together and for sealing the liquid crystal layer 45a between the active matrix substrate 30b and the opposite substrate 40a.

As shown in FIG. 5, the active matrix substrate 30b includes: a transparent substrate (10a, see FIG. 1); a plurality of gate lines 11a on the transparent substrate 10a extending parallel to each other in the horizontal direction of the drawing; a gate insulating film (12a, see FIG. 1) covering the respective gate lines 11a; a plurality of source lines 14a on the gate insulating film 12a extending parallel to each other in the direction (vertical direction in the drawing) that intersects the respective gate lines 11a; a plurality of TFTs 5, one TFT being arranged at each intersection of the respective gate lines 11a and the respective source lines 14a, or namely, at each of respective sub-pixels P; an interlayer insulating film (17a, see FIG. 1) covering the respective TFTs 5 and the respective source lines 14a; a common electrode 18a provided on the interlayer insulating film 17a; an inorganic insulating film (19a, see FIG. 1) covering the common electrode 18a; a plurality of the pixel electrodes 20b connected to the respective TFTs 5 and provided in a matrix on the inorganic insulating film 19a as the second transparent electrodes; and an alignment film (not shown) covering the respective pixel electrodes 20b.

As shown in FIG. 5, the pixel electrodes 20b have a ladder shape and have a line-and-space pattern F constituted of a plurality of line-shaped line parts L extending parallel to each other and a plurality of spaces S respectively extending between the plurality of line parts L. As shown in FIG. 5, the spaces S are provided so as not to overlap the respective openings 18c in the common electrode 18a. As shown in FIG. 5, the pixel electrodes 20b cover the edges of three sides (the left side, top side, and right side in the drawing) of the respective openings 18c in the common electrode 18a across the inorganic insulating film 19a.

The active matrix substrate 30b of the above configuration can be made if the pattern shape of the pixel electrodes 20a in the step of making the active matrix substrate of Embodiment 1 is changed.

As described above, according to the active matrix substrate 30b of the present embodiment and the lateral electrical field liquid crystal display panel provided therewith, the respective pixel electrodes 20b are the line-and-space pattern F constituted of the line-shaped line parts L and the spaces S provided so as not to overlap the respective openings 18c in the common electrode 18a; therefore, it is possible to suppress disconnection of the line parts L of the respective pixel electrodes 20b and to suppress disconnection of the line-and-space pattern F pixel electrodes 20 provided on the common electrode 18a through the inorganic insulating film 19a.

<Embodiment 3>

Figure 6:
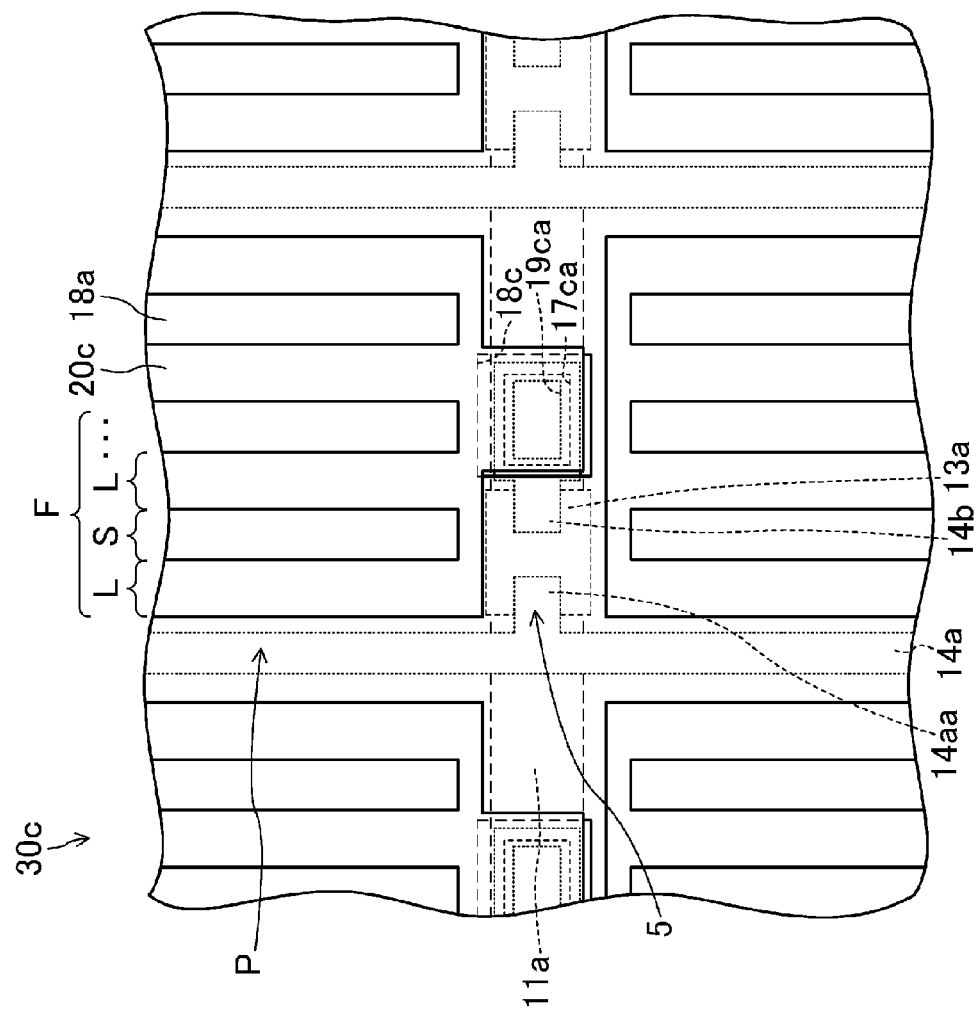
FIG. 6 is a plan view of an active matrix substrate forming a part of a liquid crystal display panel of Embodiment 3.

FIG. 6 is a plan view of an active matrix substrate 30c forming a part of a liquid crystal display panel of the present embodiment.

In Embodiment 2 described above, an example was shown in which the active matrix substrate 30b has the pixel electrodes 20b covering the three edges of the respective openings 18c in the common electrode 18a, but in the present embodiment, the active matrix substrate 30c has pixel electrodes 20c covering two edges of respective openings 18c of a common electrode 18a.

The liquid crystal display panel of the present embodiment includes: the active matrix substrate 30c and an opposite substrate (40a, see FIG. 1) facing each other; a liquid crystal layer (45a, see FIG. 1) between the active matrix substrate 30c and the opposite substrate 40a; and a frame-shaped sealing member for bonding the active matrix substrate 30c and the opposite substrate 40a together and for sealing the liquid crystal layer 45a between the active matrix substrate 30c and the opposite substrate 40a.

As shown in FIG. 6, the active matrix substrate 30c includes: a transparent substrate (10a, see FIG. 1); a plurality of gate lines 11a on the transparent substrate 10a extending parallel to each other in the horizontal direction of the drawing; a gate insulating film (12a, see FIG. 1) covering the respective gate lines 11a; a plurality of source lines 14a on the gate insulating film 12a extending parallel to each other in the direction (vertical direction in the drawing) that intersects the respective gate lines 11a; a plurality of TFTs 5, one TFT being arranged at each intersection of the respective gate lines 11a and the respective source lines 14a, or namely, at each of respective sub-pixels P; an interlayer insulating film (17a, see FIG. 1) covering the respective TFTs 5 and the respective source lines 14a; a common electrode 18a provided on the interlayer insulating film 17a; an inorganic insulating film (19a, see FIG. 1) covering the common electrode 18a; a plurality of the pixel electrodes 20c connected to the respective TFTs 5 and provided in a matrix on the inorganic insulating film 19a as the second transparent electrodes; and an alignment film (not shown) covering the respective pixel electrodes 20c.

As shown in FIG. 6, the pixel electrodes 20c have a ladder shape and have a line-and-space pattern F constituted of a plurality of line-shaped line parts L extending parallel to each other and a plurality of spaces S respectively extending between the plurality of line parts L. As shown in FIG. 6, the spaces S are provided so as not to overlap the respective openings 18c in the common electrode 18a. As shown in FIG. 6, the pixel electrodes 20c cover the edges of two sides (the top side and right side in the drawing) of the respective openings 18c in the common electrode 18a through the inorganic insulating film 19a.

The active matrix substrate 30c of the above configuration can be made if the pattern shape of the pixel electrodes 20a in the step of making the active matrix substrate of Embodiment 1 is changed.

As described above, according to the active matrix substrate 30c of the present embodiment and the lateral electrical field liquid crystal display panel provided therewith, the respective pixel electrodes 20c are the line-and-space pattern F constituted of the line-shaped line parts L and the spaces S provided so as not to overlap the respective openings 18c in the common electrode 18a; therefore, it is possible to suppress disconnection of the line parts L of the respective pixel electrodes 20c and to suppress disconnection of the line-and-space pattern F pixel electrodes 20c provided on the common electrode 18a through the inorganic insulating film 19a.

<Embodiment 4>

Figure 7:
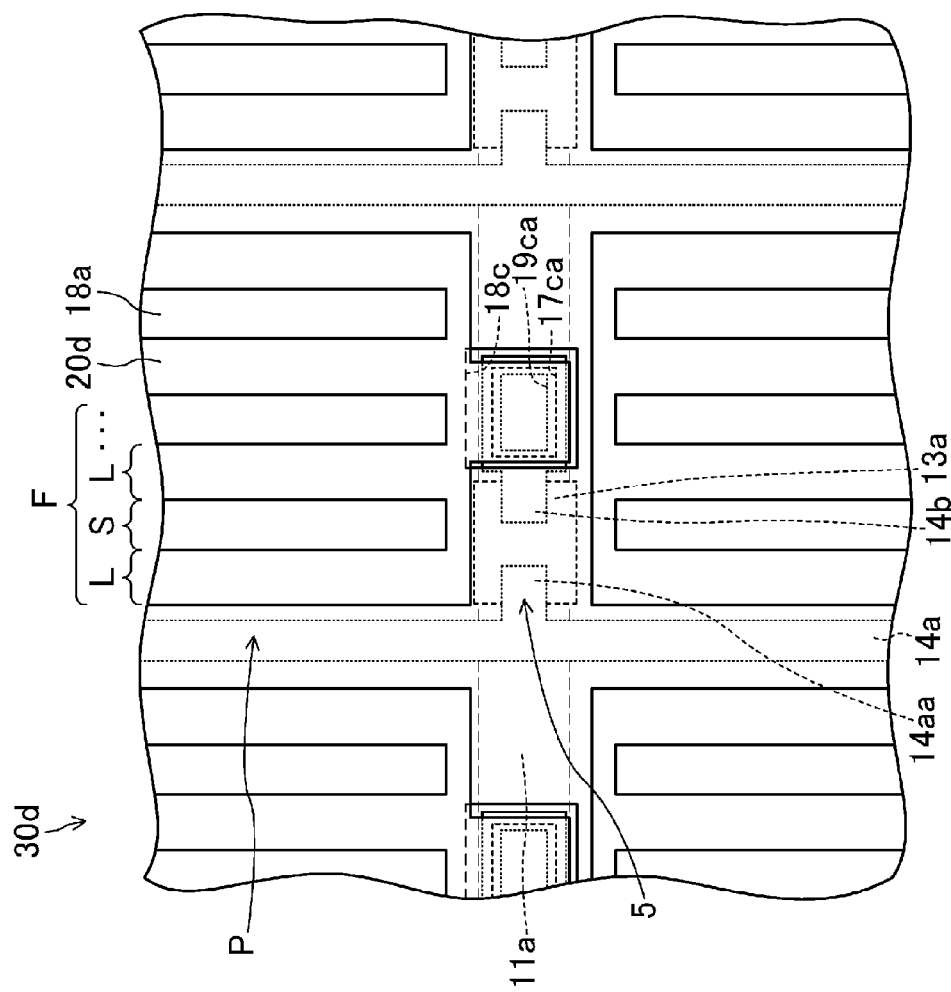
FIG. 7 is a plan view of an active matrix substrate forming a part of a liquid crystal display panel of Embodiment 4.

FIG. 7 is a plan view of an active matrix substrate 30d forming a part of a liquid crystal display panel of the present embodiment.

In Embodiment 2 described above, an example was shown in which the active matrix substrate 30b has the pixel electrodes 20b covering the three edges of the respective openings 18c in the common electrode 18a, and in Embodiment 3 an example was shown in which the active matrix substrate 30c has the pixel electrodes 20c covering two edges of respective openings 18c of the common electrode 18a, but in the present embodiment, an example is shown in which an active matrix substrate 30d has pixel electrodes 20d covering one edge of respective openings 18c in a common electrode 18a.

The liquid crystal display panel of the present embodiment includes: the active matrix substrate 30d and an opposite substrate (40a, see FIG. 1) facing each other; a liquid crystal layer (45a, see FIG. 1) between the active matrix substrate 30d and the opposite substrate 40a; and a frame-shaped sealing member for bonding the active matrix substrate 30d and the opposite substrate 40a together and for sealing the liquid crystal layer 45a between the active matrix substrate 30d and the opposite substrate 40a.

As shown in FIG. 7, the active matrix substrate 30d includes: a transparent substrate (10a, see FIG. 1); a plurality of gate lines 11a on the transparent substrate 10a extending parallel to each other in the horizontal direction of the drawing; a gate insulating film (12a, see FIG. 1) covering the respective gate lines 11a; a plurality of source lines 14a on the gate insulating film 12a extending parallel to each other in the direction (vertical direction in the drawing) that intersects the respective gate lines 11a; a plurality of TFTs 5, one TFT being arranged at each intersection of the respective gate lines 11a and the respective source lines 14a, or namely, at each of respective sub-pixels P; an interlayer insulating film (17a, see FIG. 1) covering the respective TFTs 5 and the respective source lines 14a; a common electrode 18a provided on the interlayer insulating film 17a; an inorganic insulating film (19a, see FIG. 1) covering the common electrode 18a; a plurality of the pixel electrodes 20d connected to the respective TFTs 5 and provided in a matrix on the inorganic insulating film 19a as the second transparent electrodes; and an alignment film (not shown) covering the respective pixel electrodes 20d.

As shown in FIG. 7, the pixel electrodes 20d have a ladder shape and have a line-and-space pattern F constituted of a plurality of line-shaped line parts L extending parallel to each other and a plurality of spaces S respectively extending between the plurality of line parts L. As shown in FIG. 7, the spaces S are provided so as not to overlap the respective openings 18c in the common electrode 18a. As shown in FIG. 7, the pixel electrodes 20d cover the edges of one side (the top side in the drawing) of the respective openings 18c in the common electrode 18a through the inorganic insulating film 19a.

The active matrix substrate 30d of the above configuration can be made if the pattern shape of the pixel electrode 20a in the step of making the active matrix substrate of Embodiment 1 is changed.

As described above, according to the active matrix substrate 30d of the present embodiment and the lateral electrical field liquid crystal display panel provided therewith, the respective pixel electrodes 20d are the line-and-space pattern F constituted of the line-shaped line parts L and the spaces S provided so as not to overlap the respective openings 18c in the common electrode 18a; therefore, it is possible to suppress disconnection of the line parts L of the respective pixel electrodes 20d and to suppress disconnection of the line-and-space pattern F pixel electrodes 20d provided on the common electrode 18a through the inorganic insulating film 19a.

<Embodiment 5>

Figure 8:
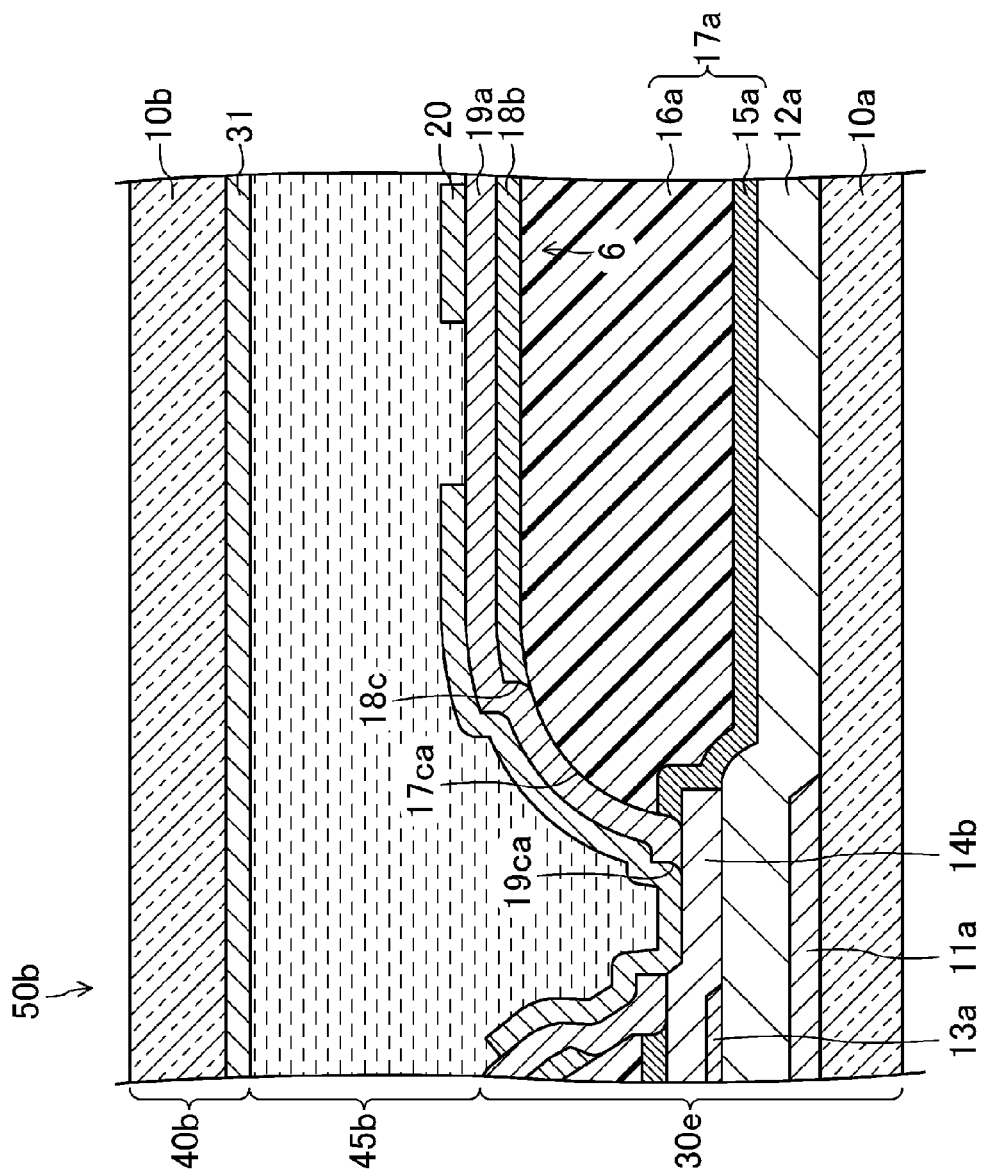
FIG. 8 is a cross-sectional view of a liquid crystal display panel according to Embodiment 5.

FIG. 8 is a cross-sectional view of a liquid crystal display panel 50b of the present embodiment.

In the respective embodiments above, the lateral electrical field liquid crystal display panel (50a) was shown as an example, but in the present embodiment, the vertical electrical field liquid crystal display panel 50b is shown as an example.

As shown in FIG. 8, the liquid crystal display panel 50b of the present embodiment includes: an active matrix substrate 30e and an opposite substrate 40b facing each other; a liquid crystal layer 45b between the active matrix substrate 30e and the opposite substrate 40b; and a frame-shaped sealing member for bonding the active matrix substrate 30e and the opposite substrate 40b together and for sealing the liquid crystal layer 45b between the active matrix substrate 30e and the opposite substrate 40b. In the liquid crystal display panel 50b, a display area that performs image display is defined inside the sealing member, and a plurality of pixels are arranged in a matrix in this display area. A sub-pixel P (see FIG. 2) for red gradient display, a sub-pixel P for green gradient display, and a sub-pixel P for blue gradient display, for example, are arrayed in the respective pixels.

As shown in FIG. 8, the active matrix substrate 30e includes: a transparent substrate 10a; a plurality of gate lines 11a on the transparent substrate 10a extending parallel to each other; a gate insulating film 12a covering the respective gate lines 11a; a plurality of source lines 14a on the gate insulating film 12a extending parallel to each other in the direction that intersects the respective gate lines 11a; a plurality of TFTs 5, one TFT being arranged at each intersection of the respective gate lines 11a and the respective source lines 14a, or namely, at each of respective sub-pixels P; an interlayer insulating film 17a covering the respective TFTs 5 and the respective source lines 14a; a first transparent electrode 18b provided on the interlayer insulating film 17a; an inorganic insulating film 19a covering the first transparent electrode 18b; a plurality of pixel electrodes 20 connected to the respective TFTs 5 and provided in a matrix on the inorganic insulating film 19a as the second transparent electrodes; and an alignment film (not shown) covering the respective pixel electrodes 20. In the active matrix substrate 30e, the pixel electrodes 20 may have any configuration from the pixel electrodes 20a to 20d in the respective embodiments above.

As shown in FIG. 8, a first transparent electrode 18b is integrally formed across all of the sub-pixels P, and has a rectangular opening 18c in each of the respective sub-pixels P for connecting the drain electrode 14b to the pixel electrode 20. As shown in FIG. 8, the first transparent electrode 18b forms an auxiliary capacitance 6 by overlapping the pixel electrodes 20 through the inorganic insulating film 19a in the respective sub-pixels P.

As shown in FIG. 8, the opposite substrate 40b includes: a transparent substrate 10b; a grid-shaped black matrix (not shown) on the transparent substrate 10b; a plurality of colored layers (not shown) such as red layers, green layers, and blue layers respectively disposed between the respective grid lines of the black matrix; a common electrode 31 covering the black matrix and the respective colored layers; a plurality of column-shaped photo spacers (not shown) on the common electrode 31; and an alignment film (not shown) covering the common electrode 31 and the respective photo spacers.

The liquid crystal layer 45b is made of a nematic liquid crystal material having electro-optical properties, or the like, and includes liquid crystal molecules of a dielectric constant anisotropy ($\Delta\epsilon < 0$). In the present embodiment, the liquid crystal layer 45b operating in VA (vertical alignment) mode was shown as an example, but the liquid crystal layer 45b may also operate in PSA (polymer sustained alignment) mode or the like.

The liquid crystal display panel 50b of the above-mentioned configuration applies a prescribed voltage for the respective sub-pixels P to the liquid crystal layer 45b arranged between the respective pixel electrodes 20 on the active matrix substrate 30e and the common electrode 31 on the opposite substrate 40b in order to change the orientation state of the liquid crystal layer 45b with a vertical electric field. This changes the transmittance of light passing through the panel for the respective sub-pixels P in order to display an image.

The liquid crystal display panel 50b of the present embodiment can be manufactured by depositing an oxide conductive film (thickness of approximately 50 nm) such as an amorphous ITO film or IZO film by sputtering, for example, on the substrate before the respective photo spacers have been formed but after the respective colored layers have been formed in the step of making the opposite substrate in Embodiment 1, thereby forming the common electrode 31.

As described above, according to the active matrix substrate 30e of the present embodiment and the vertical electrical field liquid crystal display panel 50b provided therewith, the respective pixel electrodes 20 are a line-and-space pattern F constituted of line-shaped line parts L and spaces S provided so as not to overlap the respective openings 18c in the first transparent electrode 18b; therefore, it is possible to suppress disconnection of the line parts L of the respective pixel electrodes 20 and to suppress disconnection of the line-and-space pattern F pixel electrodes 20 provided on the common electrode 18b through the inorganic insulating film 19a.

In the respective embodiments above, a bottom-gate TFT was shown as an example of a switching elements, but the present invention is also applicable to other two terminal or three terminal switching elements such as a top-gate TFT or MIM (metal insulator metal).

In the respective embodiments above, an active matrix substrate in which the electrodes of the respective TFTs connected to the pixel electrodes were drain electrodes was shown as an example, but the present invention is also applicable to an active matrix substrate in which the electrodes of the respective TFTs connected to the pixel electrode electrodes are source electrodes.

INDUSTRIAL APPLICABILITY

As described above, the present invention can suppress disconnection of line-and-space pattern second transparent electrodes provided on a first transparent electrode through an inorganic insulating film; therefore, the present invention is useful for a liquid crystal display panel that has pixel electrodes having line-and-space patterns for regulating the orientation of the liquid crystal layer and that operates in an IPS (in plane switching) mode, VA mode, PSA mode, or the like. The present invention is also useful for an active matrix substrate provided with this liquid crystal display panel.

DESCRIPTION OF REFERENCE CHARACTERS

F line-and-space pattern
L line part
P sub-pixel
S space
5 TFT (switching element)
6 auxiliary capacitance
17a interlayer insulating film
17ca contact hole
18c opening
18a common electrode (first transparent electrode)
18b first transparent electrode
19a inorganic insulating film
20, 20a to 20d pixel electrode (second transparent electrode)
30a to 30e active matrix substrate
31 common electrode
40a, 40b opposite substrate
45a, 45b liquid crystal layer
50a, 50b liquid crystal display panel

The invention claimed is:

1. An active matrix substrate, comprising:
a plurality of sub-pixels arranged in a matrix;
a switching element disposed in each of the sub-pixels;
at least one interlayer insulating film covering the switching elements and having contact holes formed in the respective sub-pixels, the contact holes reaching the respective switching elements;
a first transparent electrode disposed on the at least one interlayer insulating film and having an opening in each of the respective sub-pixels;
an inorganic insulating film covering the first transparent electrode; and
a plurality of second transparent electrodes disposed on the inorganic insulating film and respectively connecting to the switching elements through the respective contact holes in the at least one interlayer insulating film and the respective openings in the first transparent electrode,
wherein the respective second transparent electrodes have a line-and-space pattern constituted of line parts and spaces, the spaces being disposed so as not to overlap the respective openings in the first transparent electrode, and in each of the respective sub-pixels, an entire area of said opening in the first transparent electrode is covered by the corresponding second transparent electrode.

2. The active matrix substrate according to claim 1, wherein the respective second transparent electrodes cover the respective openings in the first transparent electrode across the inorganic insulating film.

3. The active matrix substrate according to claim 1,
wherein the respective openings in the first transparent electrode are rectangular, and
wherein the respective second transparent electrodes cover at least one edge of the respective openings in the first electrode across the inorganic insulating film.

4. The active matrix substrate according to claim 1, wherein the inorganic insulating film is a silicon oxide film or a silicon nitride film deposited by sputtering.

5. A liquid crystal display panel, comprising:
the active matrix substrate according to claim 1;
an opposite substrate that faces the active matrix substrate; and
a liquid crystal layer disposed between the active matrix substrate and the opposite substrate.

6. The liquid crystal display panel according to claim 5, wherein a voltage is applied to the liquid crystal layer through the first transparent electrode and the respective second transparent electrodes.

7. The liquid crystal display panel according to claim 5,
wherein a common electrode is disposed on the opposite substrate, and
wherein a voltage is applied to the liquid crystal layer through the respective second transparent electrodes and the common electrode.

* * * * *